(12) United States Patent
Miura et al.

(10) Patent No.: US 12,392,553 B2
(45) Date of Patent: Aug. 19, 2025

(54) DRYING DEVICE AND DRYING METHOD

(71) Applicant: FUJI CORPORATION, Chiryu (JP)

(72) Inventors: Kazuma Miura, Nagoya (JP); Kenji Shimosaka, Obu (JP); Daisuke Suzuki, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 736 days.

(21) Appl. No.: 17/637,325

(22) PCT Filed: Sep. 24, 2019

(86) PCT No.: PCT/JP2019/037166
§ 371 (c)(1),
(2) Date: Feb. 22, 2022

(87) PCT Pub. No.: WO2021/059318
PCT Pub. Date: Apr. 1, 2021

(65) Prior Publication Data
US 2022/0282917 A1 Sep. 8, 2022

(51) Int. Cl.
*F26B 21/00* (2006.01)
*F26B 21/06* (2006.01)
*F26B 25/00* (2006.01)

(52) U.S. Cl.
CPC ............ *F26B 21/004* (2013.01); *F26B 21/06* (2013.01); *F26B 25/003* (2013.01)

(58) Field of Classification Search
CPC ....... F26B 21/004; F26B 21/06; F26B 25/003
See application file for complete search history.

(56) References Cited

U.S. PATENT DOCUMENTS 5,379,784 A * 1/1995 Nishi ................ H01L 21/67028
134/122 R

FOREIGN PATENT DOCUMENTS

| EP | 3135390 A1 * | 3/2017 | ............. B01D 35/02 |
| EP | 3307043 A1 * | 4/2018 | ............. H05K 13/04 |
| JP | 7-201797 A | 8/1995 | |
| JP | 2012-114237 A | 6/2012 | |
| JP | 2014-168745 A | 9/2014 | |
| JP | 2017-74560 A | 4/2017 | |

OTHER PUBLICATIONS

International Search Report mailed on Dec. 3, 2019 in PCT/JP2019/037166 filed on Sep. 24, 2019 (1 page).

* cited by examiner

*Primary Examiner* — David J Laux
(74) *Attorney, Agent, or Firm* — Oblon, McClelland, Maier & Neustadt, L.L.P.

(57) ABSTRACT

A drying device includes multiple partitioned spaces, and a jetting device configured to jet air to a component holder in each of the multiple spaces.

6 Claims, 13 Drawing Sheets

DRYING DEVICE AND DRYING METHOD

TECHNICAL FIELD

The present disclosure relates to a drying device and a drying method for drying a component holder.

BACKGROUND ART

The following Patent Literature discloses a technique for drying a component holder by jetting air.

PATENT LITERATURE

Patent Literature 1: JP-A-2014-168745

BRIEF SUMMARY

Technical Problem

An object of the present specification is to appropriately dry a component holder by jetting air.

Solution to Problem

In order to achieve the object, according to the present specification, there is provided a drying device including multiple partitioned spaces; and a jetting device configured to jet air to a component holder in each of the multiple spaces.

According to the present specification, there is provided a drying device including multiple partitioned spaces; a jetting device configured to jet air to each of the multiple spaces; and a control device configured to control an operation of the jetting device, in which the control device controls an operation of the jetting device such that air is jetted to a cleaned component holder to dry the component holder in a first space that is one space among the multiple spaces, and then air is jetted to the component holder dried in the first space to dry the component holder in a second space that is a space different from the first space among the multiple spaces.

According to the present specification, there is provided a drying method of drying a cleaned component holder by using a drying device including multiple partitioned spaces and a jetting device configured to jet air to each of the multiple spaces, the drying method including a first drying step of jetting air to the cleaned component holder to dry the component holder in a first space that is one space among the multiple spaces; and a second drying step of jetting air to the component holder dried in the first space to dry the component holder in a second space that is a space different from the first space among the multiple spaces.

Advantageous Effects

According to the present disclosure, air can be jetted to a component holder in any space among multiple spaces, and thus various component holders can be suitably dried.

DESCRIPTION OF EMBODIMENTS

Hereinafter, preferred embodiments of the present disclosure will be described in detail with reference to the drawings.

Figure 1:
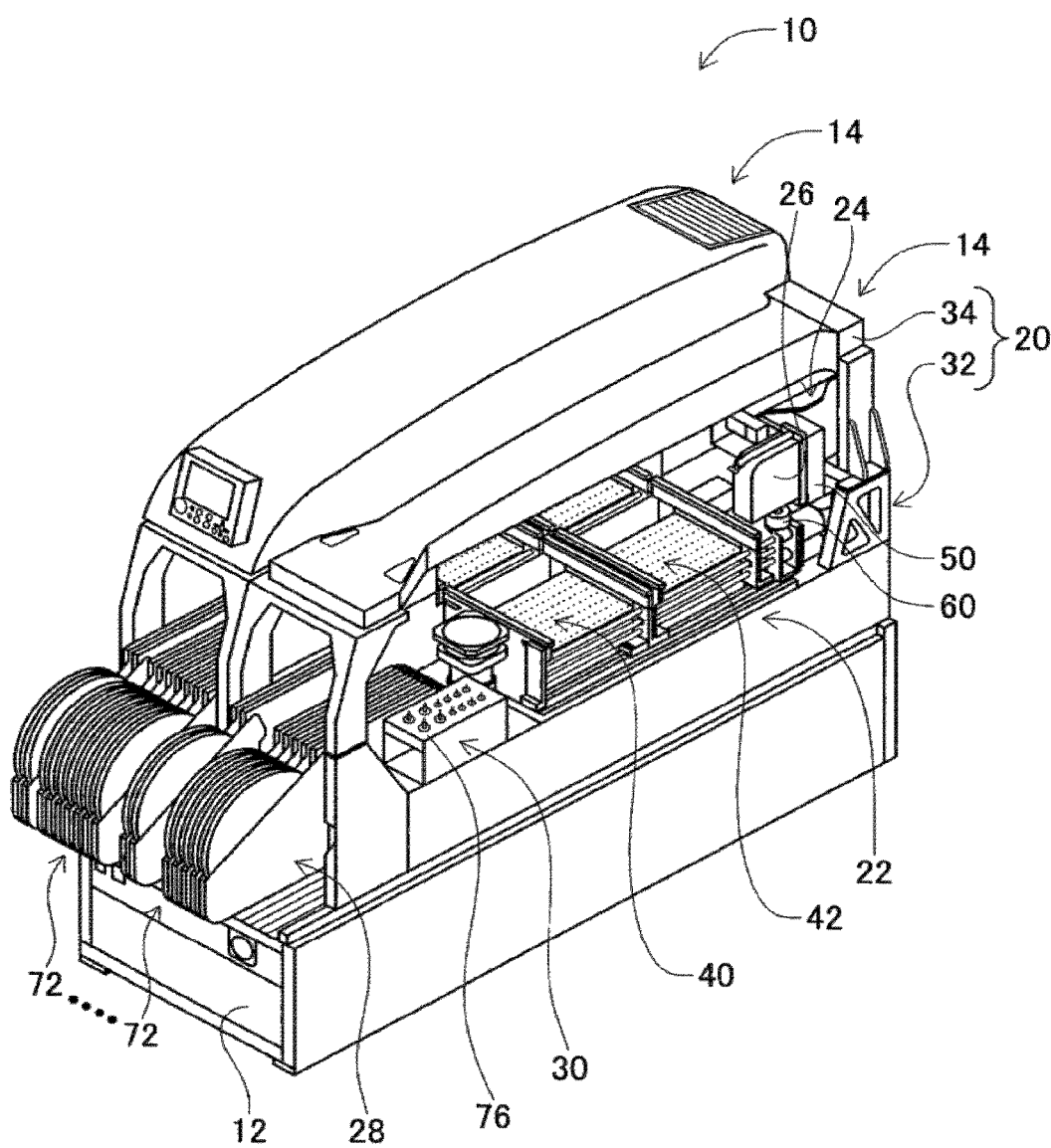
FIG. 1 is a perspective view illustrating an electronic component mounting device.

FIG. 1 illustrates electronic component mounting device 10. First, a configuration of electronic component mounting device 10 will be described. Electronic component mounting device 10 includes single system base 12 and two electronic component mounters (hereinafter, sometimes abbreviated to "mounters") 14 adjacent above system base 12. A direction in which mounters 14 are arranged will be referred to as an X-axis direction, and a horizontal direction perpendicular to the X-axis direction will be referred to as a Y-axis direction.

Each mounter 14 mainly includes mounter main body 20, conveyance device 22, mounting head moving device (hereinafter, sometimes abbreviated to a moving device) 24, mounting head 26, supply device 28, and nozzle station 30. Mounter main body 20 includes frame 32 and beam 34 that is suspended on frame 32.

Conveyance device 22 includes two conveyor devices 40 and 42. Two conveyor devices 40 and 42 are disposed parallel to each other and in such a manner as to extend in the X-axis direction on frame 32. Each of two conveyor devices 40 and 42 conveys a circuit board supported at each of conveyor devices 40 and 42 in the X-axis direction with an electromagnetic motor (not illustrated). The circuit board is held by a board holding device (not illustrated) at a predetermined position.

Moving device 24 is an XY-robot type moving device. Moving device 24 includes an electromagnetic motor (not illustrated) for sliding slider 50 in the X-axis direction, and an electromagnetic motor (not illustrated) for sliding slider 50 in the Y-axis direction. Mounting head 26 is attached to slider 50, and mounting head 26 is moved to any position on frame 32 due to an operation of two electromagnetic motors.

Figure 2:
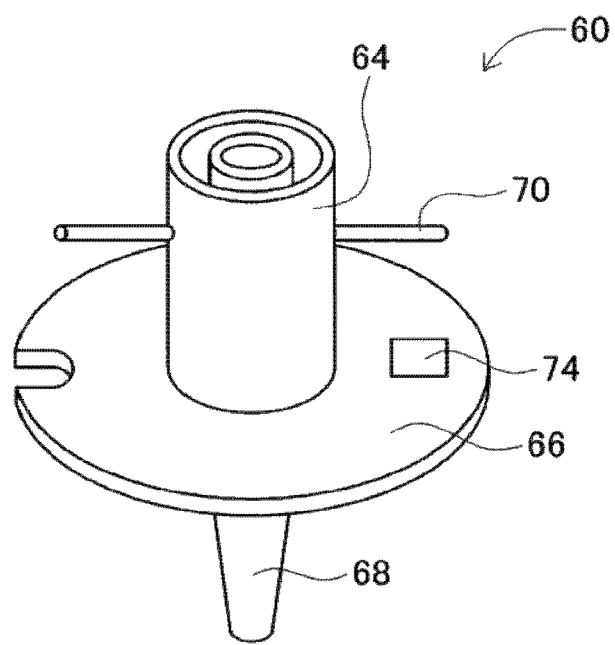
FIG. 2 is a perspective view illustrating a suction nozzle.

Mounting head 26 mounts an electronic component on a circuit board. Suction nozzle 60 is provided at a lower end face of mounting head 26. As illustrated in FIG. 2, suction nozzle 60 is configured by body cylinder 64, flange portion 66, suction pipe 68, and locking pin 70. Body cylinder 64 has a cylindrical shape, and flange portion 66 is fixed to protrude from an outer circumferential surface of body cylinder 64. Suction pipe 68 has a thin pipe shape, and is held by body cylinder 64 so as to be movable in an axial direction in a state of extending downward from a lower end part of body cylinder 64. Locking pin 70 is provided at an upper end part of body cylinder 64 so as to extend in a radial direction of body cylinder 64. Suction nozzle 60 is detachably attached to mounting head 26 by one touch by using locking pin 70. Locking pin 70 is not illustrated in FIGS. 5, 7, and 9 to 13 that will be described later. A spring (not illustrated) is built into mounting head 26, and the spring applies elastic force to suction pipe 68 of suction nozzle 60 attached to mounting head 26. Consequently, suction pipe 68 is biased in a direction extending downward from the lower end part of body cylinder 64 by the elastic force of the spring built into mounting head 26. 2D code 74 is attached to an upper surface of flange portion 66. 2D code 74 indicates an identification (ID) or the like of suction nozzle 60 as individual information. Instead of 2D code 74, a barcode or an RF tag may be attached to the upper surface of flange portion 66. However, in a case where the RF tag is attached to the upper surface of flange portion 66, a reader for acquiring individual information from the RF tag is attached to transfer head (refer to FIG. 4) 120 of nozzle management device (refer to FIG. 3) 80 that will be described later.

Suction nozzle 60 communicates with positive and negative pressure supply devices (not illustrated) via a negative pressure air passage and a positive pressure air passage. Suction nozzle 60 picks up and holds an electronic component by using a negative pressure, and separates the held electronic component by using a positive pressure. Mounting head 26 has a nozzle lifting/lowering device (not illustrated) that lifts and lowers suction nozzle 60. The nozzle lifting/lowering device changes a position of the electronic component held by mounting head 26 in the up-down direction.

Supply device 28 is a feeder-type supply device, and includes multiple tape feeders 72 as illustrated in FIG. 1. Tape feeder 72 accommodates taped components that are wound therearound. The taped component is obtained by taping an electronic component. Tape feeder 72 causes a feeding device (not illustrated) to feed the taped component. Consequently, feeder-type supply device 28 supplies an electronic component at a supply position by feeding a taped component.

Nozzle station 30 includes nozzle tray 76. Nozzle tray 76 accommodates multiple suction nozzles 60. In nozzle station 30, suction nozzle 60 attached to mounting head 26 and suction nozzle 60 accommodated in nozzle tray 76 are exchanged as required. Nozzle tray 76 is detachable from nozzle station 30, and thus collection of suction nozzle 60 accommodated in nozzle tray 76, provision of suction nozzle 60 to nozzle tray 76, and the like can be performed outside mounter 14.

Next, mounting work using mounter 14 will be described. In mounter 14, with the configuration described above, mounting work can be executed on a circuit board held by conveyance device 22 by using mounting head 26. Specifically, a circuit board is conveyed to a work position according to a command from a control device (not illustrated) of mounter 14, and is held by the board holding device at that position. Tape feeder 72 feeds a taped component according to a command from the control device, and supplies an electronic component at a supply position. Mounting head 26 is moved above the supply position of the electronic component, and picks up and holds the electronic component by using suction nozzle 60. Subsequently, mounting head 26 is moved above the circuit board, and mounts the electronic component held thereby on the circuit board.

In mounter 14, as described above, an electronic component supplied by tape feeder 72 is picked up and held by suction nozzle 60, and thus the electronic component is mounted on the circuit board. Thus, in a case where a failure has occurred in suction nozzle 60, since there is concern that the mounting work may not be appropriately performed, it is necessary to appropriately manage suction nozzle 60.

Therefore, suction nozzle 60 is managed by a nozzle management device described below.

Figure 3:
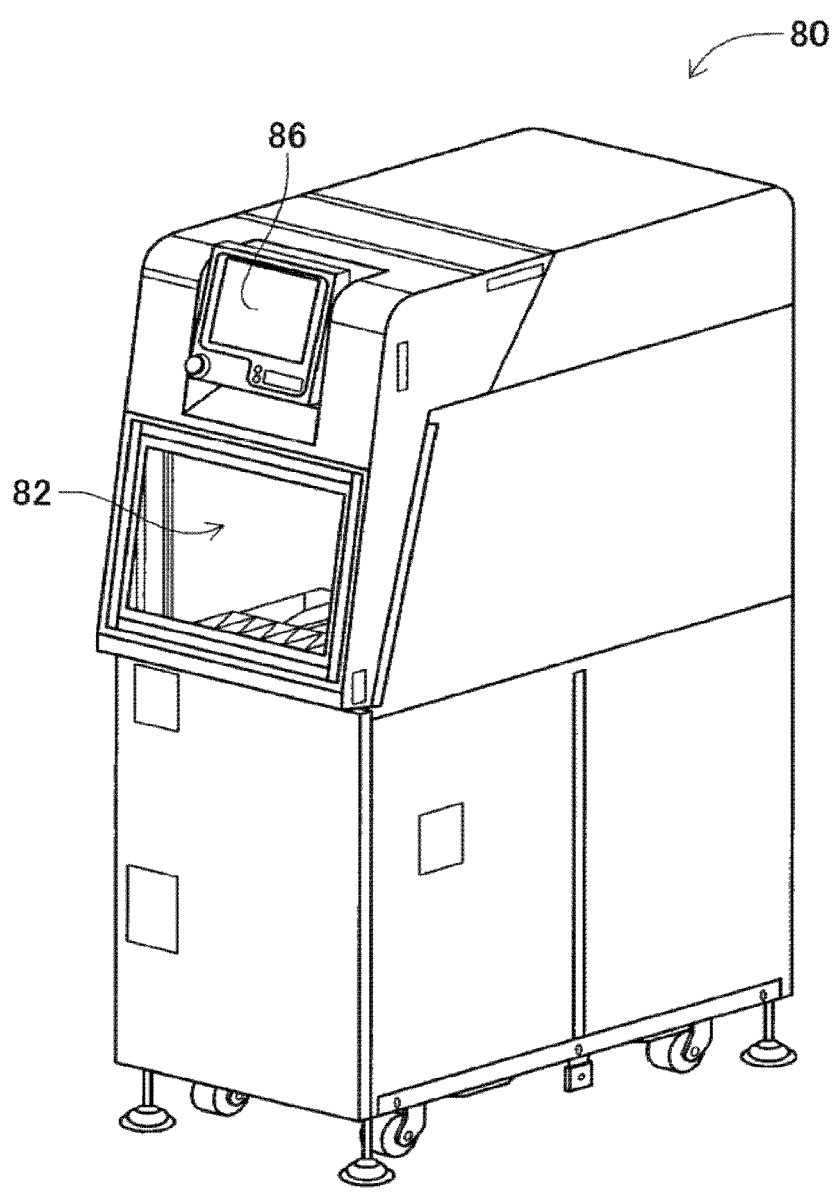
FIG. 3 is a perspective view illustrating an external appearance of a nozzle management device.

Next, a configuration of the nozzle management device will be described. As illustrated in FIG. 3, nozzle management device 80 has a generally rectangular parallelepiped shape, and is provided with door 82 through which nozzle tray 76 is stored in nozzle management device 80 or nozzle tray 76 is extracted from nozzle management device 80 on a front surface thereof. Touch panel 86 or the like that displays various pieces of information and is used to perform each operation is disposed above door 82.

Figure 4:
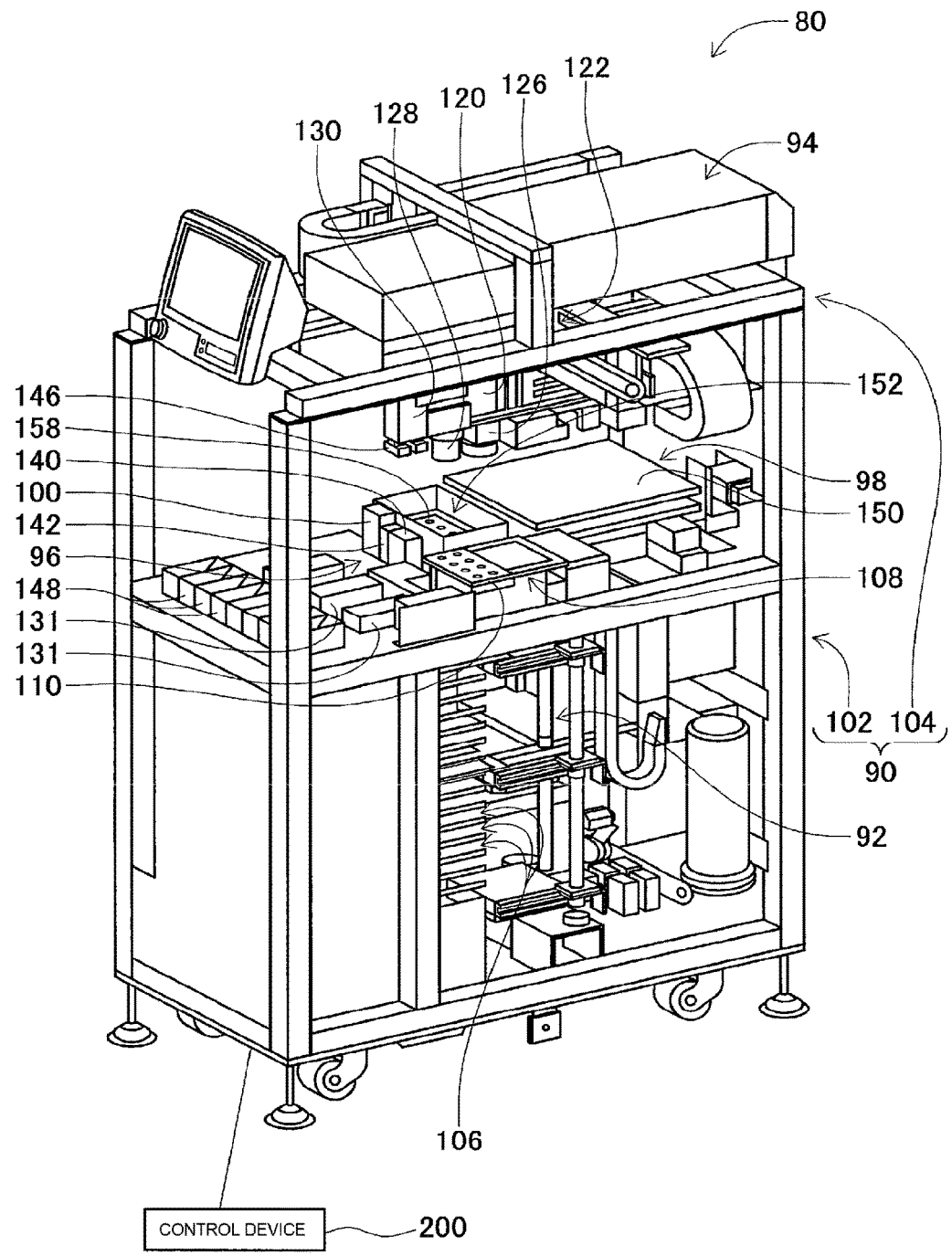
FIG. 4 is a perspective view illustrating an internal structure of the nozzle management device.

As illustrated in FIG. 4, nozzle management device 80 includes management device main body 90, pallet accommodation device 92, nozzle transfer device 94, nozzle inspection device 96, nozzle cleaning device 98, and nozzle drying device 100. FIG. 4 is a perspective view illustrating a state in which an outer shell member of nozzle management device 80 is detached, and illustrates an internal structure of nozzle management device 80. Control device 200 is connected to nozzle management device 80. Details of control device 200 will be described later.

Management device main body 90 includes frame 102 and beam 104 suspended on frame 102. Frame 102 has a hollow structure, pallet accommodation device 92 is disposed in frame 102, and an upper end part of pallet accommodation device 92 is exposed on an upper surface of frame 102.

Pallet accommodation device 92 includes multiple pallet placement shelves 106 and support arm 108. Pallet placement shelf 106 is a shelf on which nozzle pallet 110 is placed, and multiple pallet placement shelves 106 are disposed to be arranged in the up-down direction inside frame 102. Nozzle pallet 110 accommodates multiple suction nozzles 60. Support arm 108 is moved in the up-down direction ahead of multiple pallet placement shelves 106 and approaches and separates from pallet placement shelves 106 due to an operation of an arm moving device (not illustrated). Consequently, storage of nozzle pallet 110 into pallet placement shelf 106 and extraction of nozzle pallet 110 from pallet placement shelf 106 are performed by support arm 108. Nozzle pallet 110 extracted from pallet placement shelf 106 is moved above frame 102 due to upward movement of support arm 108.

Nozzle transfer device 94 is a device that transfers suction nozzle 60 between nozzle tray 76 and nozzle pallet 110, and is disposed in beam 104. Nozzle transfer device 94 includes transfer head 120 and head moving device 122. Camera 126 in a state of facing downward, holding chuck 128 that holds suction nozzle 60, and air supply device 130 are attached to a lower end face of transfer head 120.

Figure 5:
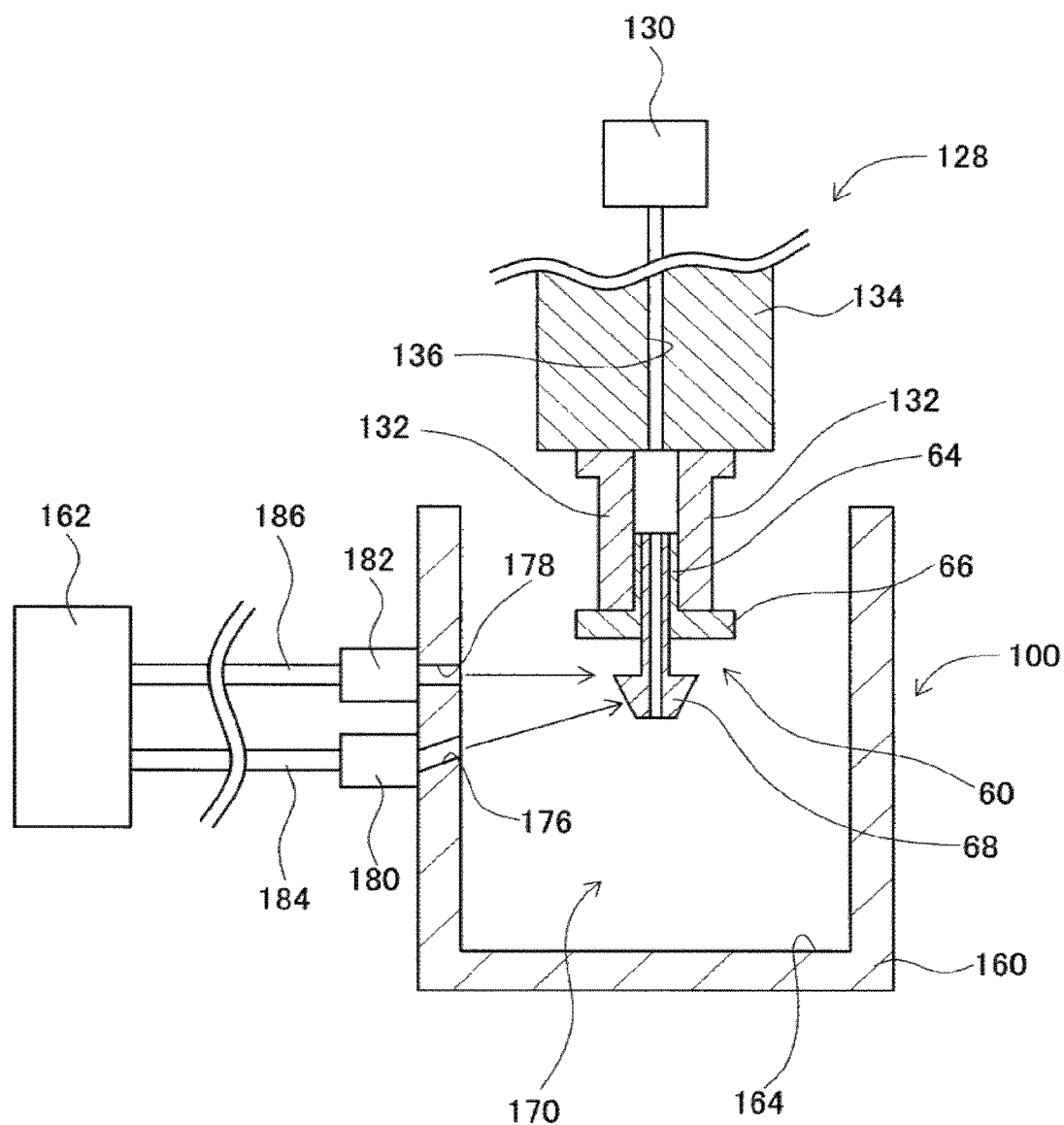
FIG. 5 is a sectional view illustrating a nozzle drying device.

As illustrated in FIG. 5, holding chuck 128 has two holding pawls 132, and by causing two holding pawls 132 to approach each other, suction nozzle 60 is held in body cylinder 64, and by causing two holding pawls 132 to separate from each other, held suction nozzle 60 is released. Air flow path 136 is formed in the main body portion 134 of the holding chuck 128. A lower end part of air flow path 136 is open between two holding pawls 132, and an upper end part thereof is connected to air supply device 130. Thus, in a state in which holding chuck 128 holds suction nozzle 60, air is supplied to air flow path 136 by air supply device 130, and thus air is jetted from the lower end part of air flow path 136 toward the inside of suction nozzle 60. Consequently, air is jetted into the inside of suction nozzle 60, and thus air is jetted from the tip portion of suction pipe 68. Holding chuck 128 has rotation device 138 (refer to FIG. 8) that rotates on its own axis. Consequently, suction nozzle 60 held by holding chuck 128 rotates.

As illustrated in FIG. 4, head moving device 122 is an XYZ type moving device that moves transfer head 120 in the front-rear direction, the left-right direction, and the up-down direction on frame 102. Fixing stage 131 for setting nozzle tray 76 is provided on an upper surface of the front side of frame 102, and suction nozzle 60 is transferred between nozzle tray 76 set on fixing stage 131 and nozzle pallet 110 supported by support arm 108 of pallet accommodation device 92.

Nozzle inspection device 96 includes camera 140, load cell 142, and joint 146. Camera 140 is disposed on the upper surface of frame 102 so as to face upward, and the tip portion of suction nozzle 60 is inspected by using camera 140. Specifically, suction nozzle 60 that is an inspection target is held by holding chuck 128, and suction nozzle 60 held by holding chuck 128 is imaged by camera 140 from below. Consequently, imaging data of the tip portion of suction nozzle 60 is obtained, and a state of the tip portion of suction nozzle 60 is inspected based on the imaging data.

Load cell 142 is disposed near camera 140, and expansion and contraction states of the tip portion of suction nozzle 60 are inspected by using load cell 142. Specifically, suction nozzle 60 that is an inspection target is held by holding chuck 128, and the tip portion of suction nozzle 60 held by holding chuck 128 comes into contact with load cell 142. As described above, the tip portion of suction nozzle 60 is allowed to expand and contract, and thus the expansion and contraction states of the tip portion of suction nozzle 60 are inspected based on a load measured by load cell 142.

Joint 146 is disposed on a lower surface of air supply device 130, and air is supplied thereto from air supply device 130. An air flow rate of suction nozzle 60 is inspected by using the air supplied from air supply device 130 to joint 146. Specifically, joint 146 is moved above suction nozzle 60 placed on cleaning pallet 158 that will be described later due to an operation of head moving device 122. Joint 146 is connected to suction nozzle 60 that is an inspection target, and thus air is supplied from air supply device 130. In this case, an air pressure is measured, and an air flow rate of suction nozzle 60 is inspected based on the air pressure.

Multiple discard boxes 148 are disposed on the upper surface of frame 102, and suction nozzle 60 determined as being a defective nozzle through the inspection is discarded into discard box 148. Suction nozzle 60 determined as being a normal nozzle through the above inspection is returned to nozzle tray 76 or nozzle pallet 110.

Nozzle cleaning device 98 is a device that cleans and dries suction nozzle 60, and is disposed near pallet accommodation device 92. Nozzle cleaning device 98 includes cleaning/drying mechanism 150 and cleaning pallet moving mechanism 152. Cleaning/drying mechanism 150 is a mechanism that cleans and dries suction nozzle 60 in the inside thereof. Cleaning pallet moving mechanism 152 is a mechanism that moves cleaning pallet 158 between an exposed position where cleaning pallet 158 is exposed (a position where cleaning pallet 158 is illustrated in FIG. 4) and the inside of cleaning/drying mechanism 150.

Figure 6:
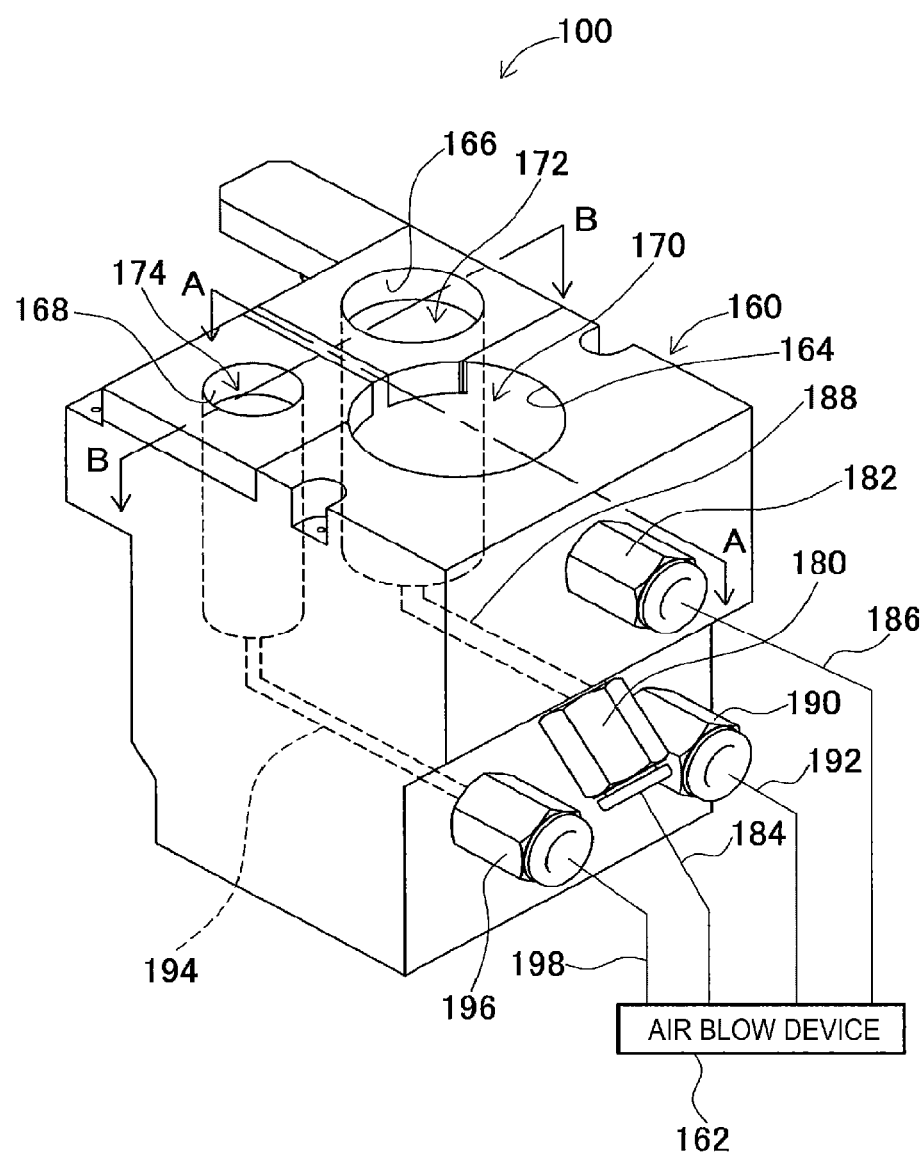
FIG. 6 is a perspective view illustrating the nozzle drying device.

Nozzle drying device 100 is a device that dries suction nozzle 60, and is disposed near cleaning pallet 158 located at the exposed position. As illustrated in FIG. 6, nozzle drying device 100 includes housing 160 and air blow device 162. Housing 160 is generally block-shaped, and three bottomed holes 164, 166, and 168 are formed in housing 160. Each of bottomed holes 164, 166, and 168 has a cylindrical shape that is open on the upper surface of housing 160 and is recessed downward. Interiors of three bottomed holes 164, 166, and 168 serve as three drying chambers 170, 172, and 174 for drying suction nozzle 60. Inner diameters of three drying chambers 170, 172, and 174 are different from each other, the inner diameter of drying chamber 170 is the largest, the inner diameter of drying chamber 174 is the smallest, and the inner diameter of drying chamber 172 is about intermediate between the inner diameter of drying chamber 170 and the inner diameter of drying chamber 174. When distinguishing three drying chambers 170, 172, and 174, drying chamber 170 will be referred to as first drying chamber 170, drying chamber 172 will be referred to as second drying chamber 172, and drying chamber 174 will be referred to as third drying chamber 174.

As illustrated in FIG. 5 which is a sectional view taken along the line AA in FIG. 6, housing 160 is provided with two through-holes 176 and 178 that extend in the radial direction of bottomed hole 164, and two through-holes 176 and 178 are open in the outer wall surface of housing 160 and the inner wall surface of first drying chamber 170. Through-hole 176 penetrates through the sidewall of housing 160 obliquely upward from the outer wall surface of housing 160 toward the inner wall surface of first drying chamber 170. On the other hand, through-hole 178 penetrates through the sidewall of housing 160 so as to extend in a generally horizontal direction above through-hole 176. Valve 180 is connected to the opening of through-hole 176 to the outer wall surface of housing 160, and valve 182 is also connected to the opening of through-hole 178 to the outer wall surface of housing 160. Valve 180 is connected to air blow device 162 via pipe 184, and valve 182 is connected to air blow device 162 via pipe 186. Consequently, air blow device 162 is operated and valves 180 and 182 are opened, and thus air is jetted from through-holes 176 and 178 toward the inside of first drying chamber 170. Valves 180 and 182 are normally closed valves.

As illustrated in FIG. 6, housing 160 is provided with through-hole 188 extending downward from the bottom surface of bottomed hole 166, that is, the bottom surface of second drying chamber 172, bent at a right angle toward the outer wall surface of housing 160, and open to the outer wall surface of housing 160. Valve 190 is connected to the opening of through-hole 188 to the outer wall surface of housing 160, and valve 190 is connected to air blow device 162 via pipe 192. Consequently, air blow device 162 is operated and valve 190 is opened, and thus air is jetted from through-hole 188 toward the inside of second drying chamber 172. Valve 190 is a normally closed valve.

Housing 160 is provided with through-hole 194 extending downward from the bottom surface of bottomed hole 168, that is, bottom surface of third drying chamber 174, bent at a right angle toward the outer wall surface of housing 160, and open to the outer wall surface of housing 160. Valve 196 is connected to the opening of through-hole 194 to the outer wall surface of housing 160, and valve 196 is connected to air blow device 162 via pipe 198. Consequently, air blow device 162 is operated and valve 196 is opened, and thus air is jetted from through-hole 194 toward the inside of third drying chamber 174. Valve 196 is a normally closed valve.

Figure 8:
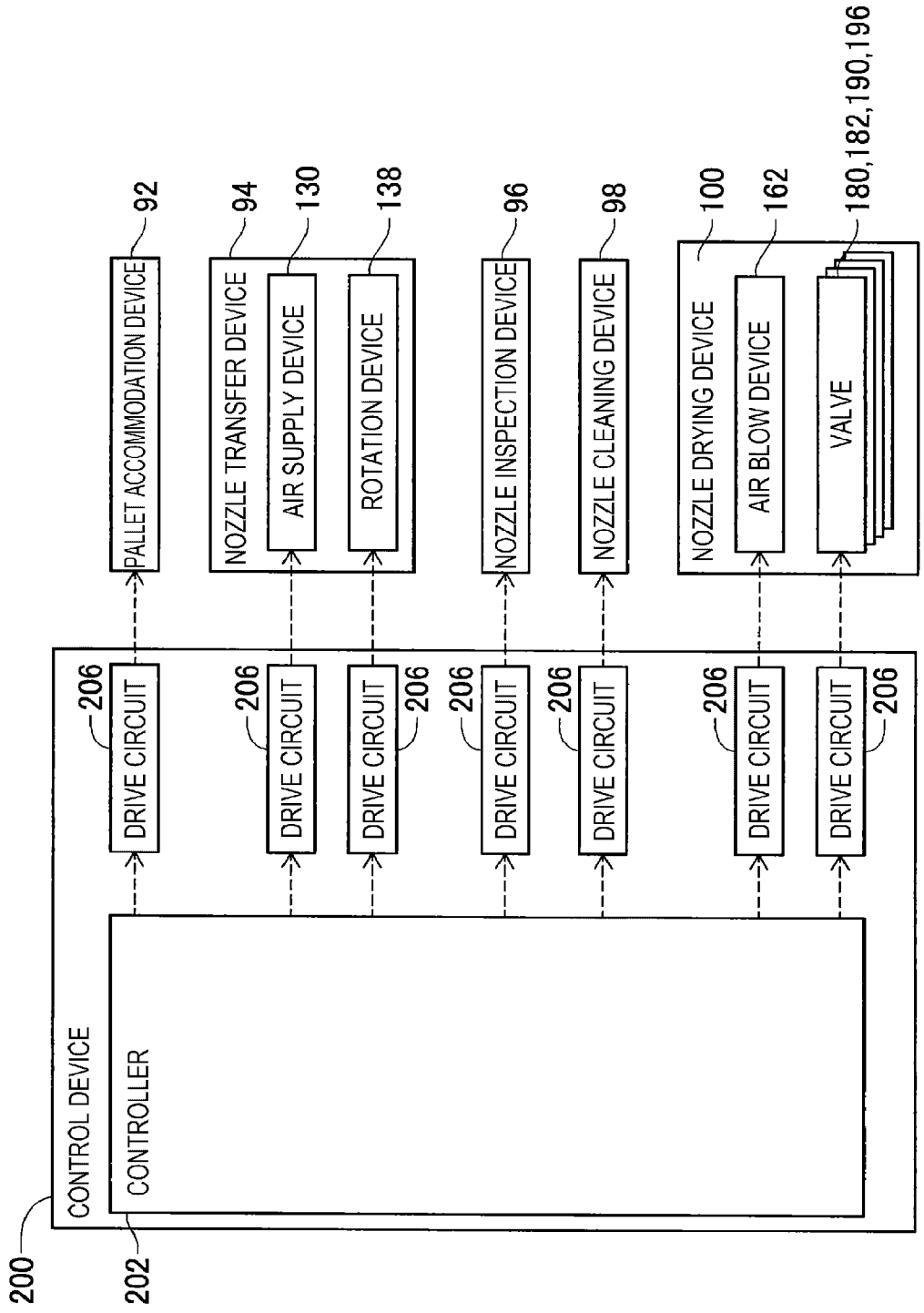
FIG. 8 is a block diagram illustrating a control device provided in the nozzle management device.

As illustrated in FIG. 8, control device 200 includes controller 202 and multiple drive circuits 206. Multiple drive circuits 206 are connected to pallet accommodation device 92, air supply device 130, rotation device 138, nozzle inspection device 96, nozzle cleaning device 98, air blow device 162, and valves 180, 182, 190, and 196. Controller 202 includes CPU, ROM, RAM, and the like, and is mainly a computer, and is connected to multiple drive circuits 206.

Consequently, operations of pallet accommodation device 92, nozzle transfer device 94, and the like are controlled by controller 202.

In nozzle management device 80, cleaning or the like of suction nozzle 60 is performed in order to appropriately manage suction nozzle 60 with the above configuration. Specifically, an operator places nozzle tray 76 in which suction nozzle 60 that is a cleaning target is accommodated on fixing stage 131 of nozzle management device 80. In nozzle management device 80, when nozzle tray 76 is placed on fixing stage 131, camera 126 is moved above placed nozzle tray 76 due to an operation of head moving device 122, and images suction nozzle 60 accommodated in nozzle tray 76. In this case, controller 202 acquires an ID of suction nozzle 60 accommodated in nozzle tray 76 based on imaging data acquired through the imaging. controller 202 manages suction nozzle 60 in nozzle management device 80 by using the acquired ID of suction nozzle 60. Control device 200 stores a size or the like of suction nozzle 60 for each ID of suction nozzle 60 and can thus also acquire the size or the like of suction nozzle 60 based on the ID of suction nozzle 60.

When the ID of suction nozzle 60 is acquired through the imaging of suction nozzle 60 accommodated in nozzle tray 76, suction nozzle 60 accommodated in nozzle tray 76 is transferred to cleaning pallet 158 of nozzle cleaning device 98 by nozzle transfer device 94. In this case, cleaning pallet 158 is moved to the exposed position due to an operation of cleaning pallet moving mechanism 152. When the transfer of suction nozzle 60 to cleaning pallet 158 is completed, cleaning pallet 158 is moved to the inside of cleaning/drying mechanism 150 due to an operation of cleaning pallet moving mechanism 152, to perform cleaning and drying of suction nozzle 60. When the cleaning and drying of suction nozzle 60 by cleaning/drying mechanism 150 is completed, cleaning pallet 158 is moved from the inside of cleaning/drying mechanism 150 to the exposed position due to an operation of cleaning pallet moving mechanism 152. In this case, holding chuck 128 is moved above cleaning pallet 158 moved to the exposed position due to an operation of head moving device 122. Air is jetted from holding chuck 128 toward suction nozzle 60 placed on cleaning pallet 158 due to an operation of air supply device 130. Consequently, moisture is blown off from the upper surface of suction nozzle 60 placed on cleaning pallet 158, particularly, the upper surface of flange portion 66, or the like.

Suction nozzle 60 is dried to some extent through drying in cleaning/drying mechanism 150 and jetting of air from holding chuck 128. However, since the drying in cleaning/drying mechanism 150 and the jetting of air from holding chuck 128 are performed in a state in which suction nozzle 60 is placed on cleaning pallet 158, there is concern that moisture may remain in suction nozzle 60. In particular, in suction nozzle 60, as described above, body cylinder 64 and suction pipe 68 are allowed to be moved relative to each other, so that since water enters between body cylinder 64 and suction pipe 68, there is a case where water entering between body cylinder 64 and suction pipe 68 remains. There is concern that suction nozzle 60 in which moisture remains between body cylinder 64 and suction pipe 68 as described above may be determined as being a defective nozzle in inspection using load cell 142. Specifically, the inspection using load cell 142 is, as described above, inspection of expansion and contraction states of the tip portion of suction nozzle 60, and in suction nozzle 60 in which moisture remains between body cylinder 64 and suction pipe 68, the sliding resistance between body cylinder 64 and suction pipe 68 is increased due to the moisture, and thus a load measured by load cell 142 is increased. Thus, it is determined that an expansion or contraction state of the tip portion of suction nozzle 60 is not appropriate, and thus there is concern that suction nozzle 60 may be determined as being a defective nozzle.

In view of this, in nozzle management device 80, when the drying in cleaning/drying mechanism 150 and the jetting of air from holding chuck 128 are completed, suction nozzle 60 is dried by using nozzle drying device 100. Specifically, when the drying in cleaning/drying mechanism 150 and the jetting of air from holding chuck 128 are completed, suction nozzle 60 placed on cleaning pallet 158 is held by holding chuck 128. Next, holding chuck 128 is moved above first drying chamber 170 of housing 160 of nozzle drying device 100 due to an operation of head moving device 122, and is then lowered. Consequently, suction nozzle 60 held by holding chuck 128 is inserted into the inside of first drying chamber 170 of housing 160, as illustrated in FIG. 5. Holding chuck 128 is lowered to a position where the lower surface side of flange portion 66 of suction nozzle 60 and the side surface of suction pipe 68 are located in the lateral direction of through-hole 178.

Thereafter, in the inside of first drying chamber 170, suction nozzle 60 held by holding chuck 128 rotates due to an operation of rotation device 138. In this case, air is jetted from holding chuck 128 due to an operation of air supply device 130, so that the air jetted from above suction nozzle 60 held by holding chuck 128 is blown to the inside of suction nozzle 60. As described above, by blowing air into suction nozzle 60, suction pipe 68 is moved relative to body cylinder 64 downward and extends downward. Consequently, the sliding surface of suction pipe 68 with respect to body cylinder 64 is exposed below flange portion 66. When holding chuck 128 rotates, air blow device 162 is operated and valves 180 and 182 are opened, and thus air is jetted from through-holes 176 and 178 toward suction nozzle 60 that is rotating. In this case, the air jetted from through-hole 178 is blown to the sliding surface of suction pipe 68 exposed from body cylinder 64 of suction nozzle 60, and the air jetted from through-hole 176 is also blown to the tip of suction pipe 68 of suction nozzle 60. That is, the air jetted from through-holes 176 and 178 is blown to the entire lower part of flange portion 66 over the entire circumference of suction nozzle 60. Consequently, it is possible to suitably remove moisture remaining between body cylinder 64 and suction pipe 68. Nozzle drying device 100 can also remove adhering matter other than moisture, specifically, for example, oil, dust, an electronic component or a part thereof, a solder, and an adhesive.

Figure 9:
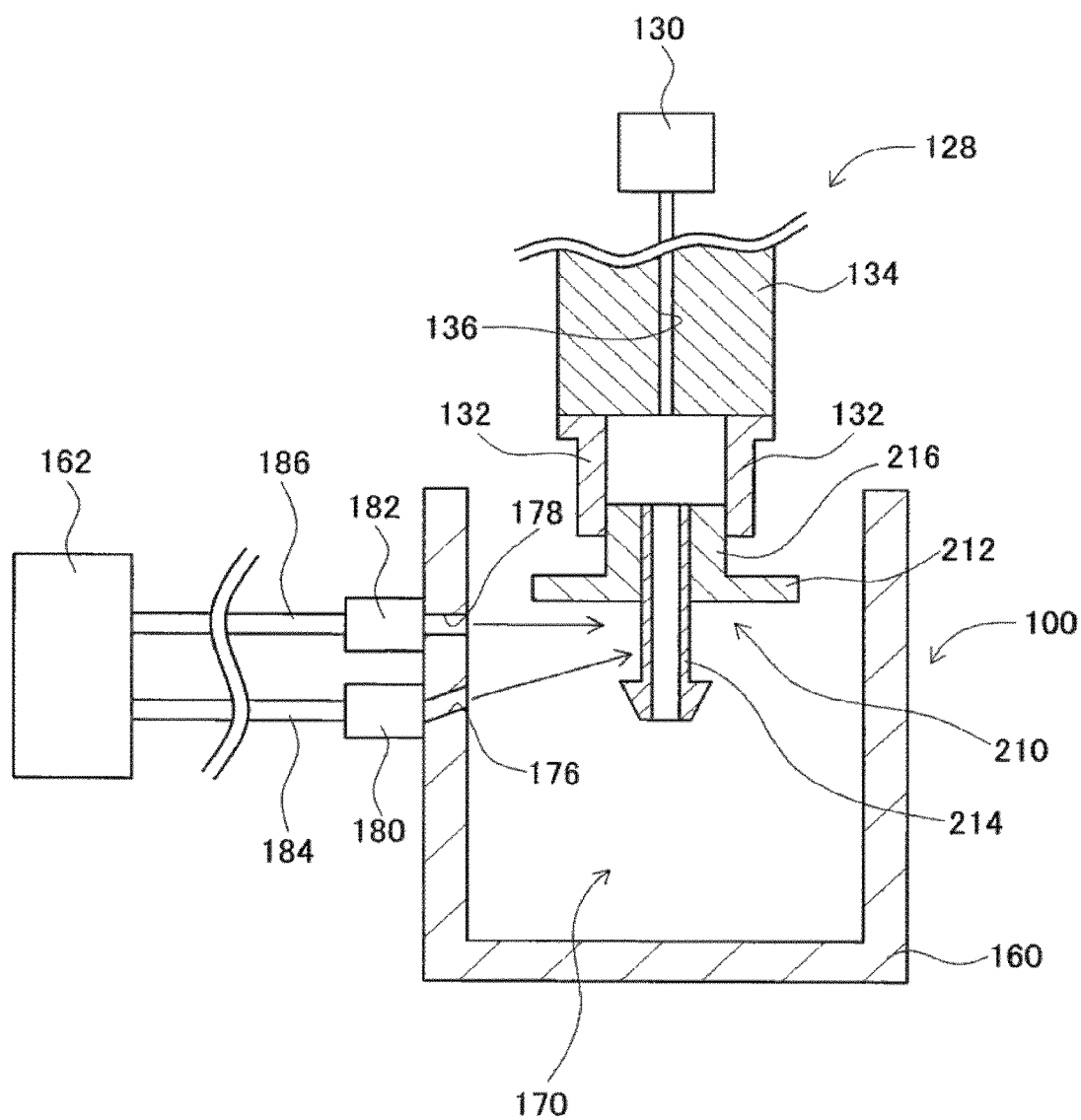
FIG. 9 is a sectional view illustrating a discard box.

As described above, in nozzle drying device 100, suction nozzle 60 can be suitably dried by jetting air to suction nozzle 60 held by holding chuck 128. However, in nozzle drying device 100, since many types of suction nozzles having different sizes are managed, there is concern that a suction nozzle having a large size cannot be suitably dried according to the above method. Specifically, in nozzle drying device 100, suction nozzle 210 (refer to FIG. 9) having a nozzle diameter larger than the nozzle diameter of suction nozzle 60 is also managed. Suction nozzle 210 after being cleaned by nozzle cleaning device 98 is held by holding chuck 128 and is inserted into first drying chamber 170 as illustrated in FIG. 9. Since the inner diameter of first drying chamber 170 is larger than the outer diameter of flange portion 212 of suction nozzle 210, entire suction nozzle 210 can be inserted into first drying chamber 170. In this case, holding chuck 128 is lowered to a position where the lower surface side of flange portion 212 of suction nozzle 210 and the side face of suction pipe 214 are located in the lateral direction of through-hole 178, and thus suction nozzle 210 is inserted into first drying chamber 170.

Suction nozzle 210 held by holding chuck 128 rotates in the same manner as suction nozzle 60, air is jetted from through-holes 176 and 178, and air is also jetted from holding chuck 128. Consequently, the sliding surface of suction pipe 214 with respect to body cylinder 216 is exposed below flange portion 212, and the air jetted from through-hole 178 is blown to the lower surface side of flange portion 212 of suction nozzle 210 and the sliding surface of suction pipe 214 exposed from body cylinder 216. However, since suction nozzle 210 is larger than suction nozzle 60, the air jetted from through-hole 176 is also blown to the sliding surface of suction pipe 214 of suction nozzle 210. That is, in first drying chamber 170, when the air is blown to suction nozzle 210 held by holding chuck 128, the air is blown to the lower surface side of flange portion 212 of suction nozzle 210 and the side surface of suction pipe 214, but the air is not blown to the tip of suction pipe 214. Thus, there is concern that the entire suction nozzle 210 cannot be suitably dried through the blowing of the air in first drying chamber 170.

Figure 7:
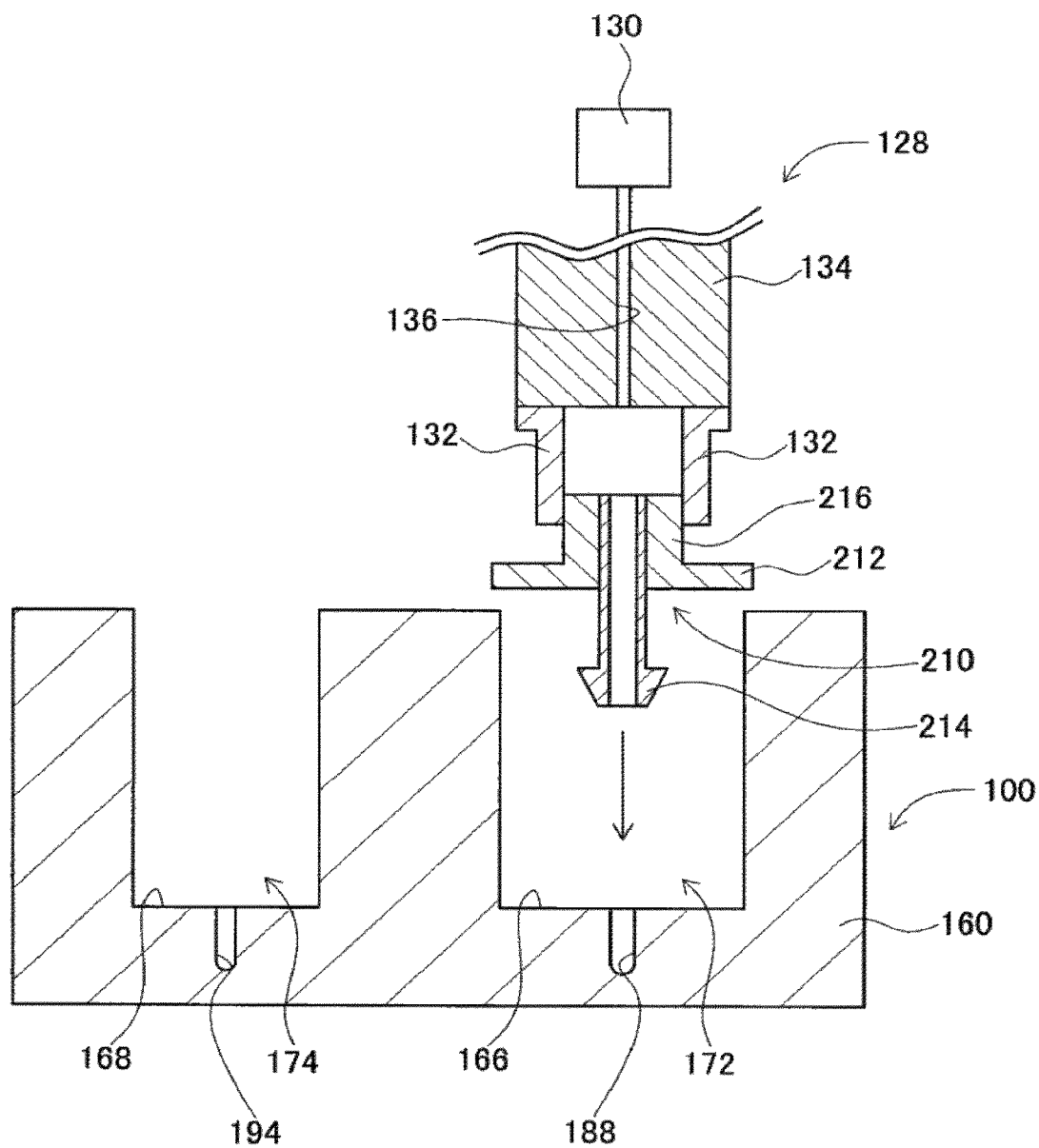
FIG. 7 is a sectional view illustrating the nozzle drying device.

Therefore, when the drying in first drying chamber 170 is finished, suction nozzle 210 held by holding chuck 128 is inserted into second drying chamber 172 of nozzle drying device 100, as illustrated in FIG. 7. However, since the outer diameter of flange portion 212 of suction nozzle 210 is larger than the inner diameter of second drying chamber 172, only suction pipe 214 of suction nozzle 210 is inserted into second drying chamber 172. In this case, suction pipe 214 of suction nozzle 210 is inserted into second drying chamber 172 such that the opening of second drying chamber 172 to the upper surface of housing 160 is covered with flange portion 212 of suction nozzle 210. However, the opening of second drying chamber 172 to the upper surface of housing 160 is covered with flange portion 212 such that a slight gap is formed between the upper surface of housing 160 and the lower surface of flange portion 212 of suction nozzle 210.

As described above, when suction pipe 214 of suction nozzle 210 held by holding chuck 128 is inserted into second drying chamber 172, air is jetted from holding chuck 128 due to an operation of air supply device 130, and thus the air jetted from above suction nozzle 210 held by holding chuck 128 is blown to the inside of suction nozzle 210. As described above, by blowing air into suction nozzle 210, suction pipe 214 is moved relative to body cylinder 216 downward and extends downward. Consequently, the sliding surface of suction pipe 214 with respect to body cylinder 216 is exposed below flange portion 212.

Figure 10:
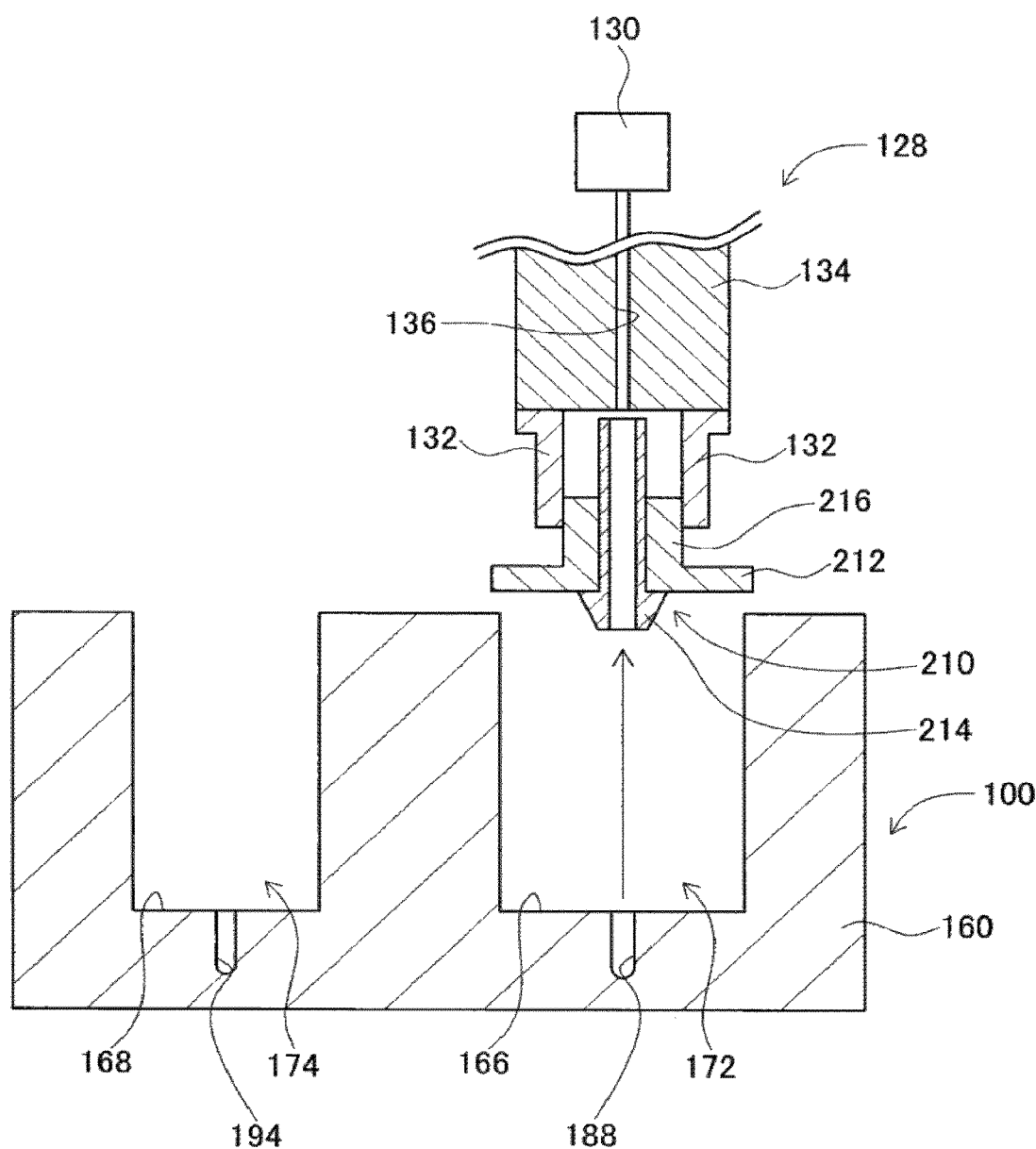
FIG. 10 is a sectional view illustrating the discard box.

Next, after the operation of air supply device 130 is stopped and the jetting of air from holding chuck 128 is stopped, air blow device 162 is operated and valve 190 is opened. Consequently, as illustrated in FIG. 10, air is jetted from through-hole 188 toward the tip of suction pipe 214 of suction nozzle 210. In this case, moisture adhering to the tip of suction pipe 214 is blown off by the air jetted toward the tip of suction pipe 214 of suction nozzle 210. By the air jetted from through-hole 188, suction pipe 214 is moved upward relative to body cylinder 216, so that suction pipe 214 extends upward, and thus the sliding surface of suction pipe 214 with respect to body cylinder 216 is exposed above body cylinder 216.

As described above, when the sliding surface of suction pipe 214 with respect to body cylinder 216 is exposed above body cylinder tube 216, the air is jetted again from holding chuck 128 due to an operation of air supply device 130 after the operation of air blow device 162 is stopped, valve 190 is closed, and the jetting of air from through-hole 188 is stopped. In this case, air is blown from holding chuck 128 to the sliding surface of suction pipe 214 exposed above body cylinder 216. Consequently, moisture adhering to the sliding surface of suction pipe 214 exposed above body cylinder 216 is blown off. As illustrated in FIG. 7, suction pipe 214 extends downward again due to the jetting of air from holding chuck 128.

As described above, when suction pipe 214 extends downward due to the jetting of air from holding chuck 128, air blow device 162 is operated again and valve 190 is opened after the operation of air supply device 130 is stopped and the jetting of air from holding chuck 128 is stopped. Consequently, air is jetted from through-hole 188, and thus suction pipe 214 extends upward again as illustrated in FIG. 10. That is, in second drying chamber 172, the jetting of air from holding chuck 128 and the jetting of air from through-hole 188 are alternately performed, and thus the air is jetted to suction pipe 214 in a state in which suction pipe 214 is repeatedly slid up and down with respect to body cylinder 216. Consequently, it is possible to suitably remove moisture remaining between body cylinder 216 and suction pipe 214 of suction nozzle 210.

That is, in suction nozzle 210 having the nozzle diameter larger than the nozzle diameter of suction nozzle 60, air is blown to a position other than the tip of suction pipe 214 below flange portion 212 in first drying chamber 170. After the blowing of air to suction nozzle 210 in first drying chamber 170 is completed, air is blown to the tip of suction pipe 214 in second drying chamber 172, and the air is blown to suction pipe 214 in a state in which suction pipe 214 is slid with respect to body cylinder 216. Consequently, entire suction nozzle 210 can be suitably dried. In second drying chamber 172, the air jetted from holding chuck 128 and through-hole 188 leaks from the gap between the upper surface of housing 160 and the lower surface of flange portion 212 of suction nozzle 210. Consequently, an increase in the air pressure in second drying chamber 172 is suppressed.

Figure 11:
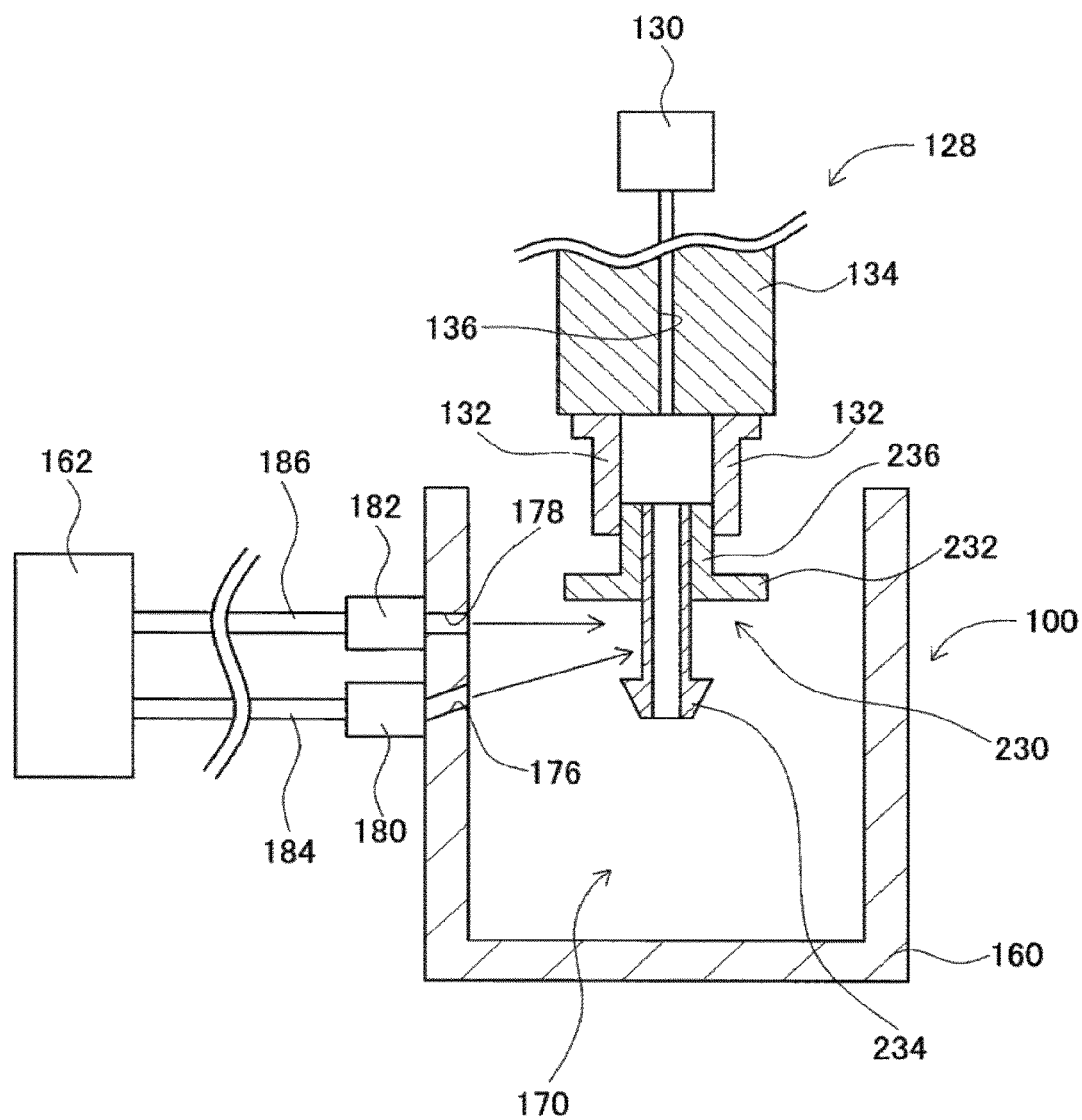
FIG. 11 is a sectional view illustrating the discard box.

In nozzle drying device 100, suction nozzle 230 (refer to FIG. 11) having the nozzle diameter larger than the nozzle diameter of suction nozzle 60 but smaller than the nozzle diameter of suction nozzle 210 is also managed. Suction nozzle 230 after being also cleaned by nozzle cleaning device 98 is held by holding chuck 128, and is inserted into first drying chamber 170 as illustrated in FIG. 11. Since the inner diameter of first drying chamber 170 is larger than the outer diameter of flange portion 232 of suction nozzle 230, entire suction nozzle 230 can be inserted into first drying chamber 170. In this case, holding chuck 128 is lowered to a position where the lower surface side of flange portion 232 of suction nozzle 230 and the side face of suction pipe 234 are located in the lateral direction of through-hole 178, and thus suction nozzle 230 is inserted into first drying chamber 170.

Suction nozzle 230 held by holding chuck 128 also rotates in the same manner as suction nozzle 60, air is jetted from through-holes 176 and 178, and air is also jetted from holding chuck 128. Consequently, the sliding surface of suction pipe 234 with respect to body cylinder 236 is exposed below flange portion 232, and thus the air jetted from through-hole 178 is blown to the lower surface side of flange portion 232 of suction nozzle 60 and the sliding surface of suction pipe 234 exposed from body cylinder 236. However, since suction nozzle 230 is also larger than suction nozzle 60, the air jetted from through-hole 176 is blown to the sliding surface of suction pipe 234, and is not blown to the tip of suction pipe 234. Thus, entire suction nozzle 230 cannot be suitably dried by blowing the air in first drying chamber 170.

Figure 12:
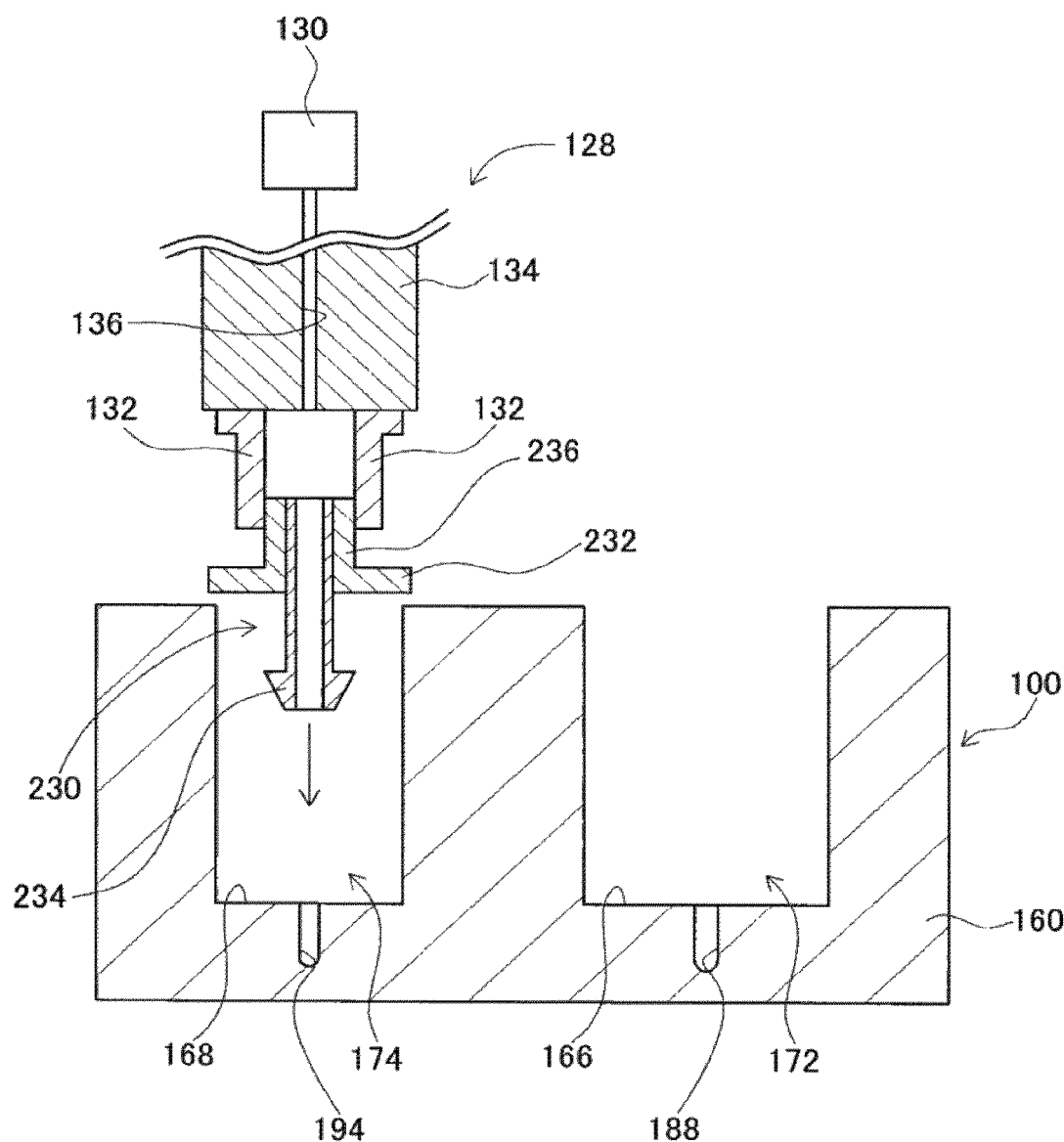
FIG. 12 is a sectional view illustrating the discard box.

Therefore, when the drying in first drying chamber 170 is finished, suction nozzle 230 held by holding chuck 128 is inserted into third drying chamber 174 of nozzle drying device 100, as illustrated in FIG. 12. However, since the outer diameter of flange portion 232 of suction nozzle 230 is larger than the inner diameter of third drying chamber 174, only suction pipe 234 of suction nozzle 230 is inserted into third drying chamber 174. In this case, suction pipe 234 of suction nozzle 230 is inserted into third drying chamber 174 such that the opening of third drying chamber 174 to the upper surface of housing 160 is covered with flange portion 232 of suction nozzle 230. However, the opening of third drying chamber 174 to the upper surface of housing 160 is covered with flange portion 232 such that a slight gap is formed between the upper surface of housing 160 and the lower surface of flange portion 232 of suction nozzle 230.

As described above, when suction pipe 234 of suction nozzle 230 held by holding chuck 128 is inserted into third drying chamber 174, the jetting of air from holding chuck 128 and the jetting of air from through-hole 194 are alternately performed in the same manner as in second drying chamber 172. That is, first, air is jetted from holding chuck 128 due to an operation of air supply device 130, and thus the air jetted from above suction nozzle 230 held by holding chuck 128 is blown to the inside of suction nozzle 230. Consequently, as illustrated in FIG. 12, suction pipe 234 is moved downward relative to body cylinder 236 and extends downward, and thus the sliding surface of suction pipe 234 with respect to body cylinder 236 is exposed below flange portion 232.

Figure 13:
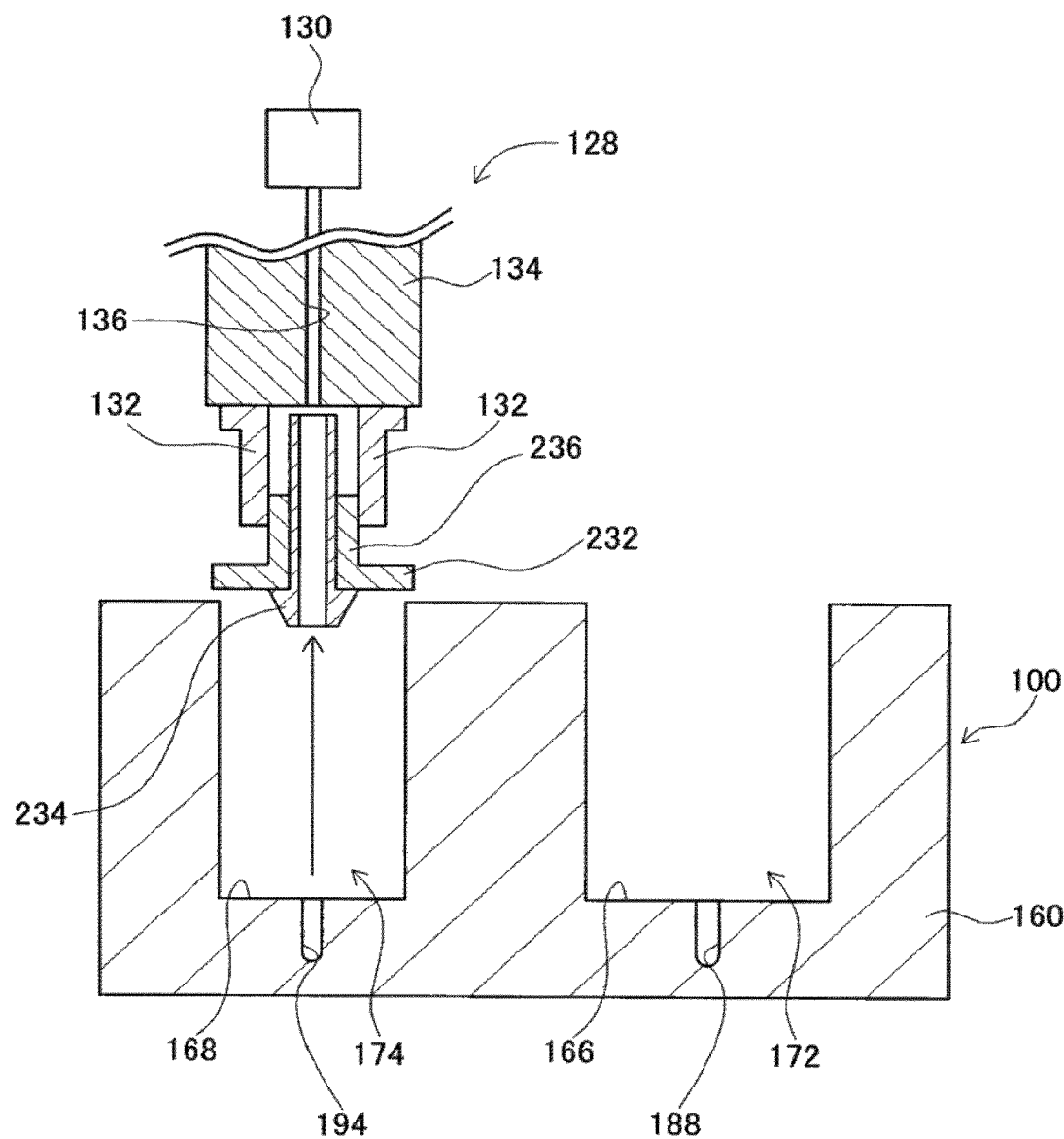
FIG. 13 is a sectional view illustrating the discard box.

Next, after the operation of air supply device 130 is stopped and the jetting of air from holding chuck 128 is stopped, air blow device 162 is operated and valve 196 is opened. Consequently, as illustrated in FIG. 13, air is jetted from through-hole 194 toward the tip of suction pipe 234 of suction nozzle 230. In this case, moisture adhering to the tip of suction pipe 234 is blown off by the air jetted toward the tip of suction pipe 234 of suction nozzle 230. Suction pipe 234 is moved upward relative to body cylinder 236 by the air jetted from through-hole 194 such that suction pipe 234 extends upward, and thus the sliding surface of suction pipe 234 with respect to body cylinder 236 is exposed above body cylinder 236.

The jetting of air from holding chuck 128 and the jetting of air from through-hole 194 are alternately performed, and thus the air is jetted to suction pipe 234 in a state in which suction pipe 234 is repeatedly slid up and down with respect to body cylinder 236. Consequently, it is possible to suitably remove moisture remaining between body cylinder 236 and suction pipe 234 of suction nozzle 230.

That is, in suction nozzle 230 having the nozzle diameter larger than the nozzle diameter of suction nozzle 60 and smaller than the nozzle diameter of suction nozzle 210, air is blown to a position other than the tip of suction pipe 234 below flange portion 232 in first drying chamber 170. After the blowing of air to suction nozzle 230 in first drying chamber 170 is completed, air is blown to the tip of suction pipe 234 in third drying chamber 174, and the air is blown to suction pipe 234 in a state in which suction pipe 234 is slid with respect to body cylinder 236. Consequently, entire suction nozzle 230 can be suitably dried. In third drying chamber 174, the air jetted from holding chuck 128 and through-hole 194 leaks from the gap between the upper surface of housing 160 and the lower surface of flange portion 232 of suction nozzle 230. Consequently, an increase in the air pressure in third drying chamber 174 is suppressed.

As described above, in nozzle management device 80, suction nozzle 60 having a relatively small size is dried through blowing of air in first drying chamber 170. Suction nozzle 210 having a relatively large size is dried through blowing of air in first drying chamber 170, and then dried through blowing of air in second drying chamber 172. Suction nozzle 230 having a size intermediate between suction nozzle 60 and suction nozzle 210 is dried through blowing of air in first drying chamber 170, and then dried through blowing of air in third drying chamber 174. That is, in nozzle management device 80, the suction nozzle is dried in one or more of three drying chambers 170, 172, and 174 according to a size thereof. Consequently, it is possible to appropriately dry the suction nozzles having various sizes.

A size of a suction nozzle that is a drying target is determined based on an ID of the suction nozzle acquired previously. That is, when the suction nozzle is stored in nozzle management device 80, controller 202 acquires the ID of the suction nozzle based on imaging data obtained by camera 126, as described above. Control device 200 stores data in which the ID of the suction nozzle and the size of the suction nozzle are correlated with each other. Thus, controller 202 specifies the size of the suction nozzle that is a drying target based on the ID of the suction nozzle that is a drying target by referring to the data. Controller 202 dries the suction nozzle according to the above-described method based on the specified size of the suction nozzle.

The suction nozzle dried according to a method corresponding to the size of the suction nozzle is subjected to inspection in nozzle inspection device 96, and the suction nozzle of which an inspection result is favorable is accommodated in nozzle tray 76 placed on fixing stage 131 or nozzle pallet 110 of pallet accommodation device 92. The suction nozzle of which the inspection result is not favorable is discarded into discard box 148 disposed next to fixing stage 131.

Suction nozzle 60 is an example of a component holder and a suction nozzle. Flange portion 66 is an example of a flange portion. Suction pipe 68 is an example of a nozzle. Nozzle drying device 100 is an example of a drying device. Air blow device 162 is an example of a jetting device. First drying chamber 170 is an example of a first space. Second drying chamber 172 is an example of a second space. Third drying chamber 174 is an example of a second space. Through-holes 176 and 178 are an example of a first jetting port. Through-holes 188 and 194 are an example of a second jetting port. Control device 200 is an example of a control device. Suction nozzle 210 is an example of a component holder and a suction nozzle. Flange portion 212 is an example of a flange portion. Suction pipe 214 is an example of a nozzle. Suction nozzle 230 is an example of a component holder and a suction nozzle. Flange portion 232 is an example of a flange portion. Suction pipe 234 is an example of a nozzle.

Thus, the above-described present embodiment achieves the following effects.

In nozzle drying device 100, multiple drying chambers 170, 172, and 174 are provided, and air is jetted to a suction nozzle held by holding chuck 128 in each of multiple drying chambers 170, 172, and 174. Consequently, air can be blown to the suction nozzle in any of multiple drying chambers 170, 172, and 174, and thus various suction nozzles can be suitably dried.

In nozzle drying device 100, suction nozzle 210 held by holding chuck 128 is dried in first drying chamber 170 and is then dried in second drying chamber 172, and suction nozzle 230 held by holding chuck 128 is dried in first drying chamber 170 and is then dried in third drying chamber 174. Consequently, air can be blown in second drying chamber 172 or third drying chamber 174 to the tips of suction pipes 214 and 234 of suction nozzles 210 and 230 to which air cannot be blown in first drying chamber 170, and thus entire suction nozzles 210 and 230 can be appropriately dried.

In nozzle drying device 100, jetting of air from holding chuck 128 and jetting of air from through-holes 188 and 194 are alternately performed in second drying chamber 172 or third drying chamber 174, and thus air is jetted to suction pipes 214 and 234 while sliding suction pipes 214 and 234 of suction nozzles 210 and 230. That is, in second drying chamber 172 or third drying chamber 174, jetting of air from above and jetting of air from below suction nozzles 210 and 230 are alternately performed, and thus air is jetted to suction pipes 214 and 234 while expanding and contracting suction pipes 214 and 234 of suction nozzles 210 and 230. Consequently, it is possible to suitably remove moisture remaining between body cylinders 216 and 236 and suction pipes 214 and 234 of suction nozzles 210 and 230.

In nozzle drying device 100, the inner diameter of first drying chamber 170 is made larger than the outer diameters of flange portions 212 and 232 of suction nozzles 210 and 230. Therefore, entire suction nozzles 210 and 230 are inserted into first drying chamber 170, and air is blown to a portion other than the tips of suction pipes 214 and 234 of suction nozzles 210 and 230. On the other hand, the inner diameter of second drying chamber 172 is made smaller than the outer diameter of flange portion 212 of suction nozzle 210, and the inner diameter of third drying chamber 174 is made smaller than the outer diameter of flange portion 232 of suction nozzle 230. Thus, suction pipes 214 and 234 of suction nozzles 210 and 230 are inserted into second drying chamber 172 or third drying chamber 174, and air is blown to the tips of suction pipes 214 and 234. Consequently, entire suction nozzles 210 and 230 can be appropriately dried.

In nozzle drying device 100, three drying chambers 170, 172, and 174 are provided, and the inner diameters of three drying chambers 170, 172, and 174 are different from each other. Consequently, air can be blown to suction nozzles having various sizes in any of three drying chambers 170, 172, and 174, and thus the suction nozzles having various sizes can be appropriately dried.

The present disclosure is not limited to the above embodiment, and can be implemented in various forms where various modifications and improvements are made based on the knowledge of those skilled in the art. Specifically, for example, although the above embodiment discloses the suction nozzle drying method, the present disclosure may be applied to various component holders as long as the component holders can hold components. For example, the present disclosure may be applied to a gripper that grips a component with multiple pawls, that is, a so-called chuck.

In the above embodiment, the suction nozzle is dried in drying chambers 170, 172, and 174 partitioned by the inner wall surfaces of bottomed holes 164, 166, and 168, but the suction nozzle may be dried in spaces partitioned by at least one surface.

In the above embodiment, suction nozzles 210 and 230 are dried in first drying chamber 170, and are then dried in second drying chamber 172 or third drying chamber 174, but may be dried in first drying chamber 170 after being dried in second drying chamber 172 or third drying chamber 174.

In the above embodiment, suction nozzles 210 and 230 are dried in two of three drying chambers 170, 172, and 174, but may be dried in one drying chamber. In such a case, it is necessary to provide a drying chamber capable of blowing air to entire suction nozzles 210 and 230. Specifically, for example, a drying chamber in which a through-hole similar to through-hole 188 of second drying chamber 172 is formed is provided in first drying chamber 170, and thus air can be blown to entire suction nozzles 210 and 230 in one of the drying chambers.

In the above embodiment, for example, the opening of second drying chamber 172 to the upper surface of housing 160 is covered with flange portion 212 such that a slight gap is formed between the upper surface of housing 160 and the lower surface of flange portion 212 of suction nozzle 210, and thus an increase in the air pressure in second drying chamber 172 is suppressed. On the other hand, by forming a leak hole in second drying chamber 172 or through-hole 188, an increase in the air pressure in second drying chamber 172 may be suppressed. In such a case, the opening of second drying chamber 172 to the upper surface of housing 160 may be covered with flange portion 212 such that the upper surface of housing 160 and the lower surface of flange portion 212 of suction nozzle 210 are in close contact with each other. By disposing a silencer in the leak hole, it is possible to suppress wind noise. A similar method can be naturally employed in third drying chamber 174.

REFERENCE SIGNS LIST

60: Suction nozzle (component holder), 66: Flange portion, 68: Suction pipe (nozzle), 100: Nozzle drying device (drying device), 162: Air blow device (jetting device), 170: First drying chamber (first space), 172: Second drying chamber (second space), 174: Third drying chamber (second space), 176: Through-hole (first jetting port), 178: Through-hole (first jetting port), 188: Through-hole (second jetting port), 194: Through-hole (second jetting port), 200: Control device, 210: Suction nozzle (component holder), 212: Flange portion, 214: Suction pipe (nozzle), 230: Suction nozzle (component holder), 232: Flange portion, 234: Suction pipe (nozzle)

The invention claimed is:

1. A drying method of drying a component holder by using a drying device including multiple spaces and a jetting device configured to jet air to each of the multiple spaces, the drying method comprising:
   a first moving step of controlling a transfer head to move the component holder into a first space of the multiple spaces;
   a first drying step of jetting air to the component holder to partially dry the component holder in the first space;
   a second moving step of controlling the transfer head to move the component holder into a second space of the multiple spaces, an inner diameter of the first space being larger than an inner diameter of the second space; and
   a second drying step of jetting the air to the component holder, previously partially dried in the first space, to further dry the component holder in the second space.

2. A drying device comprising:
   a transfer head that moves a component holder, the component holder configured to hold components;
   multiple spaces including a first space and a second space, an inner diameter of the first space being larger than an inner diameter of the second space;

a jetting device configured to jet air to each of the multiple spaces; and control circuity configured to
- control the transfer head to move the component holder into the first space,
- control the jetting device such that air is jetted to the component holder to partially dry the component holder in the first space,
- control the transfer head to move the component holder into the second space, and
- control the jetting device such that the air is jetted to the component holder, previously partially dried in the first space, to further dry the component holder in the second space.

3. The drying device according to claim 2, wherein
the first space is provided with a first jetting port that is a jetting port for jetting air toward a predetermined portion of the component holder, and
the second space is provided with a second jetting port that is a jetting port for jetting air toward a portion different from the predetermined portion of the component holder.

4. The drying device according to claim 2, wherein
the component holder is a suction nozzle having an expandable and contractible nozzle, and
the suction nozzle is dried while expanding and contracting the nozzle by alternately performing jetting of air from above the suction nozzle and jetting of air from below the suction nozzle in at least one of the first space and the second space.

5. The drying device according to claim 2, wherein
the component holder has a flange portion,
each of the multiple spaces is a space that is partitioned by a sidewall and is open above,
the inner diameter of the first space is larger than an outer diameter of the flange portion, and
the inner diameter of the second space is smaller than the outer diameter of the flange portion.

6. The drying device according to claim 2, wherein
the multiple spaces are three or more spaces,
each of the three or more spaces is a space that is partitioned by a sidewall and is open above, and
inner diameters of openings of the three or more spaces are different from each other.

* * * * *